(12) United States Patent
Nishijima (10) Patent No.: US 11,650,337 B2
(45) Date of Patent: May 16, 2023

(54) CONVERTER ARRAY, DETECTOR, AND PHOTODIODE ARRAY

(71) Applicant: Canon Medical Systems Corporation, Otawara (JP)

(72) Inventor: Akira Nishijima, Nasushiobara (JP)

(73) Assignee: Canon Medical Systems Corporation, Otawara (JP)

(*) Notice: Subject to any disclaimer, the term of this patent is extended or adjusted under 35 U.S.C. 154(b) by 344 days.

(21) Appl. No.: 16/924,311

(22) Filed: Jul. 9, 2020

(65) Prior Publication Data

US 2021/0011179 A1 Jan. 14, 2021

(30) Foreign Application Priority Data

Jul. 11, 2019 (JP) .............................. JP2019-129498

(51) Int. Cl.
*G01T 1/20* (2006.01)
*H03M 1/12* (2006.01)
*G01N 23/046* (2018.01)

(52) U.S. Cl.
CPC .......... *G01T 1/20184* (2020.05); *H03M 1/12* (2013.01); *G01N 23/046* (2013.01)

(58) Field of Classification Search
CPC . G01N 23/046; G01T 1/20184; G01T 1/2985; H03M 1/12; H03M 1/123
See application file for complete search history.

(56) References Cited

U.S. PATENT DOCUMENTS

2018/0184035 A1* 6/2018 Kim .................... H04N 5/37455

FOREIGN PATENT DOCUMENTS

JP 2001-215281 A 8/2001
JP 2011-245209 A 12/2011

OTHER PUBLICATIONS

Office Action dated Feb. 21, 2023, in Japanese Patent Application No. 2019-129498 filed Jul. 11, 2019, citing documents 15 therein, 5 pages.

* cited by examiner

*Primary Examiner* — Mark R Gaworecki
(74) *Attorney, Agent, or Firm* — Oblon, McClelland, Maier & Neustadt, L.L.P.

(57) ABSTRACT

According to one embodiment, a converter array includes a first substrate, multiple sets of a plurality of analog-digital converters and a switch. The multiple sets are arranged on the first substrate in array. The switch is configured to switch a connection relationship between the plurality of analog-digital converters to process signals from photodiodes smaller in number than the analog-digital converters.

6 Claims, 7 Drawing Sheets

CONVERTER ARRAY, DETECTOR, AND PHOTODIODE ARRAY

CROSS-REFERENCE TO RELATED APPLICATIONS

This application is based upon and claims the benefit of priority from the prior Japanese Patent Application No. 2019-129498, filed Jul. 11, 2019, the entire contents of which are incorporated herein by reference.

FIELD

Embodiments described herein relate generally to a to a converter array, a detector, and a photodiode array.

BACKGROUND

As a detector for an X-ray CT apparatus, there is an X-ray detector in which a detector and a data acquisition system (DAS) are integrated on a chip.

Since the detector and DAS of the X-ray detector are integrated on a chip, the X-ray detector exhibits excellent performance, but has a problem of cost because chips need to be separately produced for respective resolutions such as a normal resolution and a high-definition resolution.

DETAILED DESCRIPTION

In general, according to one embodiment, a converter array includes a first substrate, multiple sets of a plurality of analog-digital converters and a switch. The multiple sets are arranged on the first substrate in array. The switch is configured to switch a connection relationship between the plurality of analog-digital converters to process signals from photodiodes smaller in number than the analog-digital converters.

Hereinafter, a converter array, detector, and photodiode array according to the present embodiments will be described with reference to the accompanying drawings. In the following embodiments, elements assigned with the same reference numerals perform the same operations, and redundant descriptions will be omitted as appropriate.

First Embodiment

A detector including a converter array according to a first embodiment will be described with reference to FIG. 1.

Figure 1:
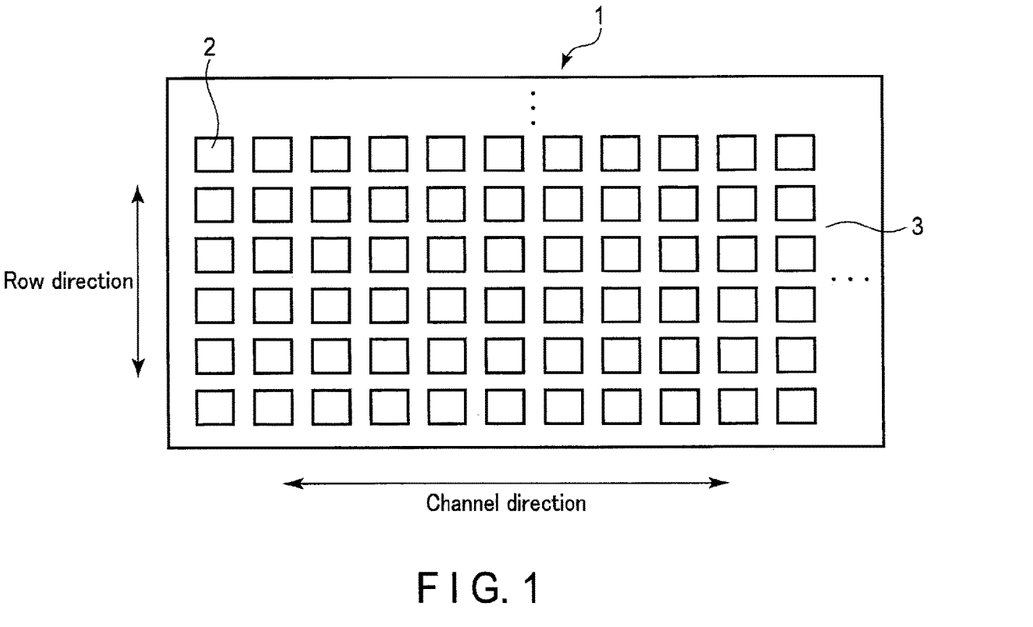
FIG. 1 is a diagram showing a detector including a converter array according to a first embodiment.

FIG. 1 is a plan view schematically showing a detector 1 viewed in a radiation incident direction. In the detector 1, detector cells 2 each corresponding to one pixel are two-dimensionally arrayed on a substrate 3. In the example of FIG. 1, the longitudinal direction is the row direction corresponding to the body axis of the subject, and the lateral direction is the channel direction of the detector 1. Although not shown in FIG. 1, the detector 1 of the present embodiment is assumed to be integrated with an analog-digital converter (ADC) which is part of a data acquisition system (hereinafter referred to as a "DAS") to form an integral-type detector, and ADCs larger than or equal to the detector cells 2 in number are arranged in a lower layer of the detector 1 so as to form pairs with the detector cells 2, each of which corresponds to one pixel. A plurality of arrayed ADCs are called a converter array.

Figure 2:
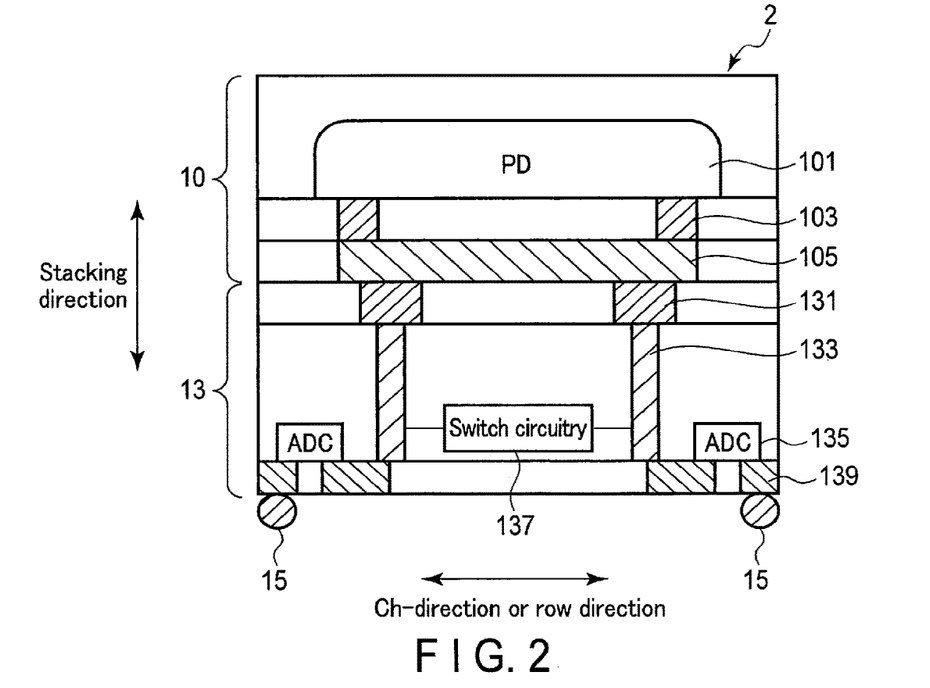
FIG. 2 is a cross-sectional view of the detector according to the first embodiment.

Next, a cross-sectional view of the detector 1 according to the first embodiment is shown in FIG. 2.

FIG. 2 is a cross-sectional view of the detector 1 focusing on a detector cell 2, which serves as one pixel. The longitudinal direction is a stacking direction of the substrate 3, and the lateral direction may be the channel (Ch-) direction or the row direction. Namely, the detector 1 includes two-dimensionally arrayed, i.e., multiple, sets of a photodiode and a plurality of analog-digital converters (ADCs), each set being a pixel unit.

The detector 1 includes a photodiode substrate 10 in which a plurality of photodiodes are arrayed, and an ADC substrate 13 including a plurality of analog-digital converters (ADCs). The detector cells 2 are assumed to be two-dimensionally arrayed in the channel direction and the row direction in the first embodiment, but need not necessarily be two-dimensionally arrayed and may be one-dimensionally aligned in the channel direction. In the integral-type converter, the photodiode substrate 10 is surface-connected to the ADC substrate 13. Namely, the back surface of the photodiode substrate 10 is connected or bonded to the front surface of the ADC substrate 13.

Hereinafter, the photodiode substrate 10 will also be referred to as a PDA chip 10. Similarly, the ADC substrate 13 will also be referred to as an ADC chip 13. The PDA chip 10 and ADC chip 13 are assumed to be substrates integrated into one body, and are connected by, for example, direct bonding.

The PDA chip 10 shown in FIG. 2 includes a photodiode 101, contact holes 103, and a interconnect layer 105. The ADC chip 13 includes with an electrode pad 131, a connection electrode 133, an ADC 135, switch circuitry 137, and a conducting layer 139.

The photodiode 101 of the PDA chip 10 is for a normal resolution (NR), and the ADC chip 13 is for a high-definition resolution (HDR), which is higher than the normal resolution. The normal resolution is set for a normal mode scan, the high-definition resolution (HDR) is set for a high-definition mode. The normal resolution will also be referred to as a normal mode, the HDR will also be referred to as a high-definition mode. The number of photodiodes 101 of the normal mode is smaller than the number of ADCs 135 of the high-definition mode.

The photodiode 101 receives light into which X-rays have been converted by a scintillator (not shown), and converts the light into an electrical signal.

Each contact hole 103 is formed to be electrically connected to the lower surface of the photodiode 101, and draws an electrical signal from the photodiode 101 to the interconnect layer 105. The contact hole 103 may be configured, for example, by filling a conductor such as a metal into a through hole, or by plating the inner wall of a through hole.

The interconnect layer 105 is a circuit pattern formed of, for example, a conductor, and is arranged between the PDA chip 10 and ADC chip 13. The interconnect layer 105 is formed to be electrically connected to the lower surfaces of the contact holes 103, and bundles electrical signals drawn through the contact holes 103.

The electrode pad 131 is formed to be electrically connected to the lower surface of the interconnect layer 105, and draws an electrical signal. The electrode pad 131 is formed of, for example, a conductor.

The connection electrode 133 is formed to be electrically connected to the lower surface of the electrode pad 131, and transmits an electrical signal to the ADC 135. The connection electrode 133 may have the same configuration as the contact hole 103.

The ADC 135 is electrically connected to the connection electrode 133, and analog-digital-converts an electrical signal, which is an analog signal, into a digital signal. The ADC 135 is constituted by, for example, an ASIC. Since the ADC chip 13 is a substrate for the high-definition mode, two ADCs 135 are arranged herein.

The ADC 135 may include an integration circuit. The integration circuit integrates electrical signals over a one-view period, and thereby generates an integral signal. The peak value of the integral signal corresponds to the dose of X-rays detected over the one-view period by a detection element (e.g., PDA chip 101) to which the integration circuit is connected. The ADC 135 converts the integral signal obtained by integrating electrical signals transmitted from the connection electrode 133 over a certain period of time into a digital signal.

The integration circuit may be formed separately from the ADC 135 as long as it is electrically connected between the connection electrode 133 and the ADC 135.

The switch circuitry 137 switches between two ADCs 135 to process signals from photodiodes 101 fewer than the ADCs 135 in number. Specifically, the switch circuitry 137 switches the ADC 135 to which an analog signal is input.

The conducting layer 139 is a circuit pattern formed of, for example, a conductor, and is electrically connected to the lower surface of the ADC 135 to draw a digital signal to a subsequent stage.

The terminal 15 is electrically connected to the lower surface of the conducting layer 139, and transmits the digital signal to circuitry in the subsequent stage, such as control circuitry. The terminal 15 is formed of, for example, a conductor.

The interconnect layer 105 is assumed to be formed on the surface of the PDA chip 10 which faces the ADC chip 13, but may be formed by a separate discrete layer. The ADC 135 may be arranged on the upper surface side of the ADC chip 13 (immediately below the PDA chip 10) as long as an electrical signal can be input to the ADCs 135 without the mediation of the connection electrode 133.

The above-described detector 1 is assumed to be an indirect-conversion-type detector, but may be a direct-conversion-type detector which includes a semiconductor device configured to convert incident X-rays into an electrical signal, instead of the scintillator and the PDA chip.

Figure 3:
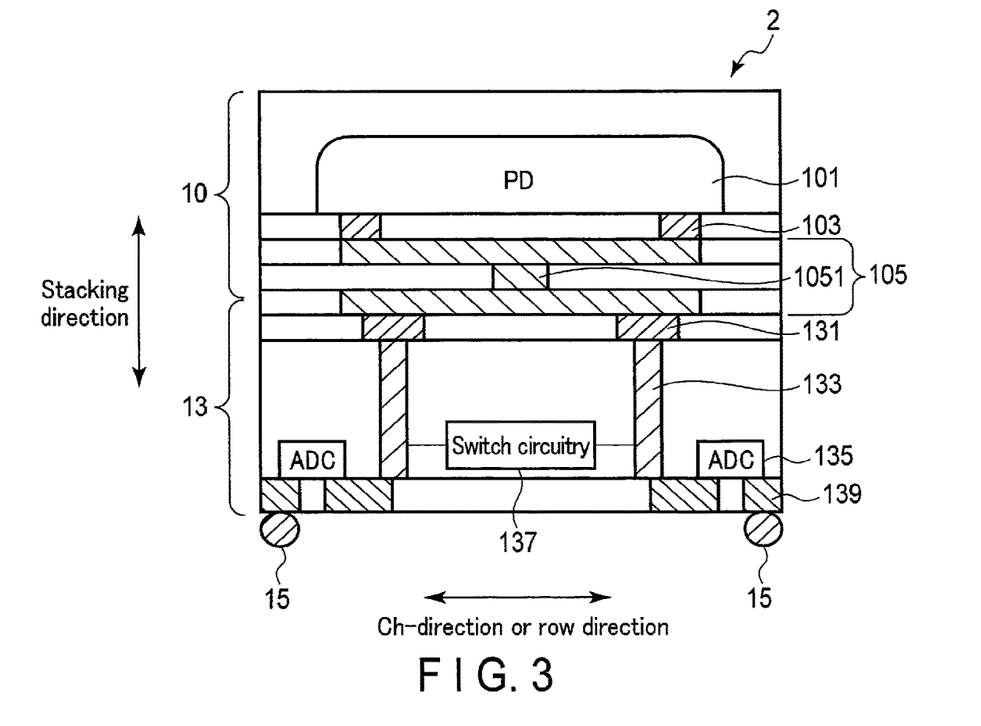
FIG. 3 is a diagram showing another example of a interconnect layer of the detector.

Another example of the interconnect layer 105 of the detector 1 is shown in FIG. 3.

As shown in FIG. 3, a bundle layer 1051 which bundles bifurcated signals from the photodiode 101 may be provided, and electrical signals that branch off from the bundle layer 1051 may be drawn.

The contact hole 103 may be directly connected to the electrode pad 131 without the interconnect layer 105 provided therebetween.

Next, an example of a simultaneous reading method which uses the detector 1 including the detector cell 2 shown in FIG. 2 will be described with reference to FIGS. 4A and 4B.

Figure 4A:
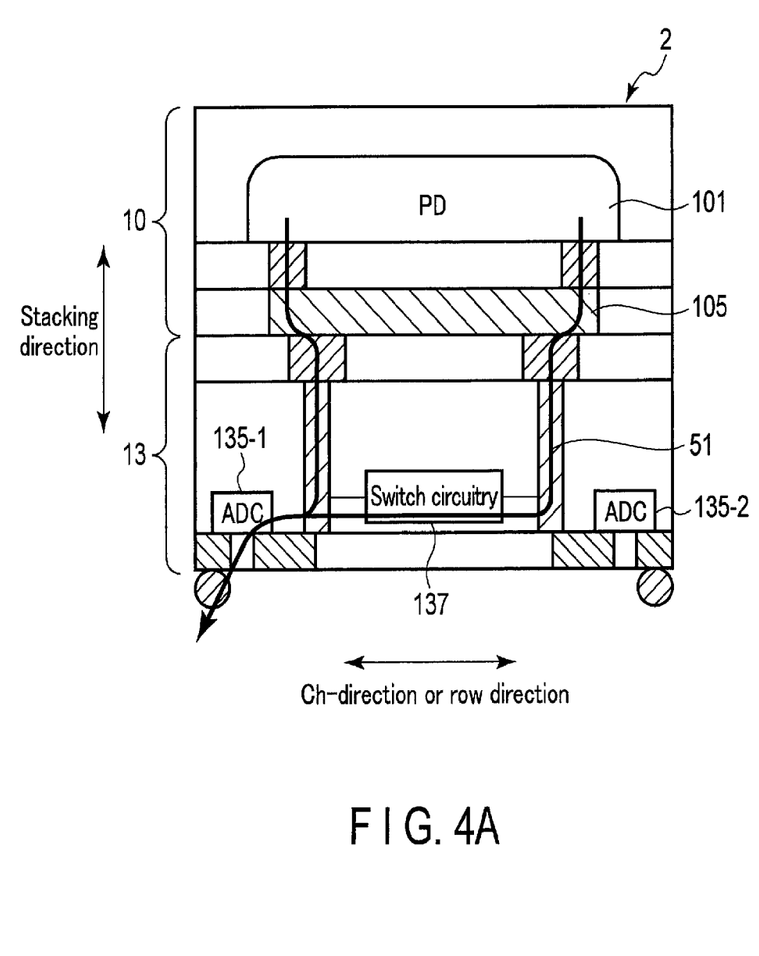
FIGS. 4A and 4B are diagrams showing an example of a simultaneous reading method, which uses the detector including a detector cell shown in FIG. 2.
Figure 4B:
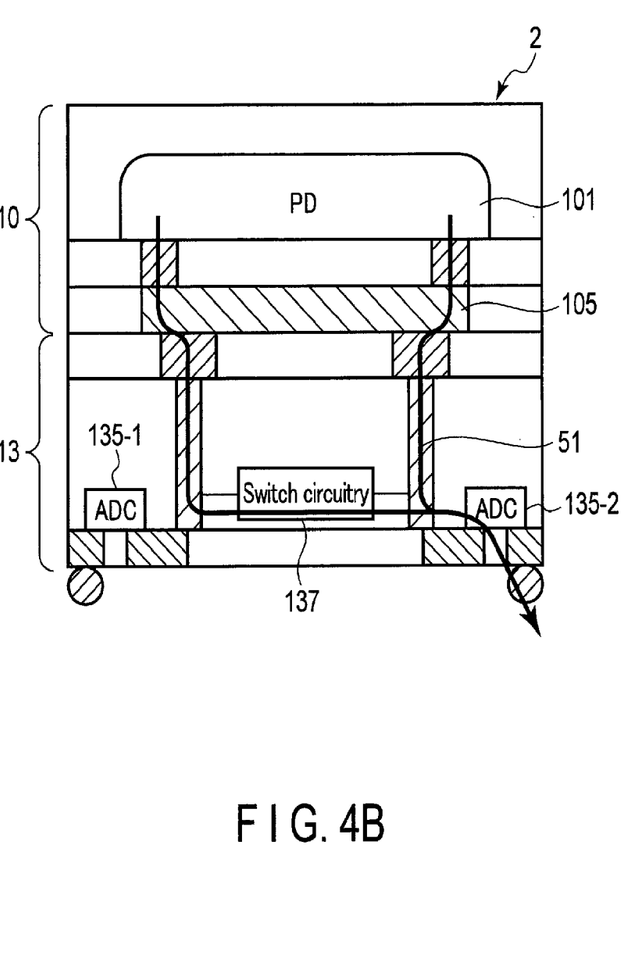

FIGS. 4A and 4B show a simultaneous reading method in which the ADC chip 13 for the high-definition mode reads an electrical signal 51 from the PDA chip 10 for the normal mode. Note that FIGS. 4A and 4B schematically show the flow of the electrical signal 51, and does not specifically show the actual transmission path.

In the case of FIG. 4A, the switch circuitry 137 is turned on. The switch circuitry 137 switches circuitry so that an electrical signal is transmitted to the ADC 135-1 side. The electrical signal 51 from the photodiode is read only on the ADC 135-1 side, and ADC 135-2 is not used.

FIG. 4B shows the state after the ADC 135 that reads the electrical signal 51 is switched from the ADC 135-1. Specifically, the switch circuitry 137 switches circuitry so that an electrical signal is transmitted to the ADC 135-2 side. The electrical signal 51 from the photodiode is read only on the ADC 135-2 side, and ADC 135-1 is turned off and is not used. In this way, the electrical signal 51 is read by sequential (alternate) switching between a plurality of ADCs 135. The time intervals for switching between ADCs 135 may be any intervals as long as data input to each ADC 135 does not overflow.

The ADC 135 for the high-definition mode has a circuitry size corresponding to the pixel size for the high-definition mode, and thus may not be able to process the electrical signal corresponding to the pixel size for the normal mode all together; however, the ADC 135 for the high-definition mode can be used for reading an electrical signal corresponding to the pixel size for the normal mode by switching between ADCs at predetermined time intervals.

Next, another example of the detector 1 according to the first embodiment will be described with reference to FIG. 5.

Figure 5:
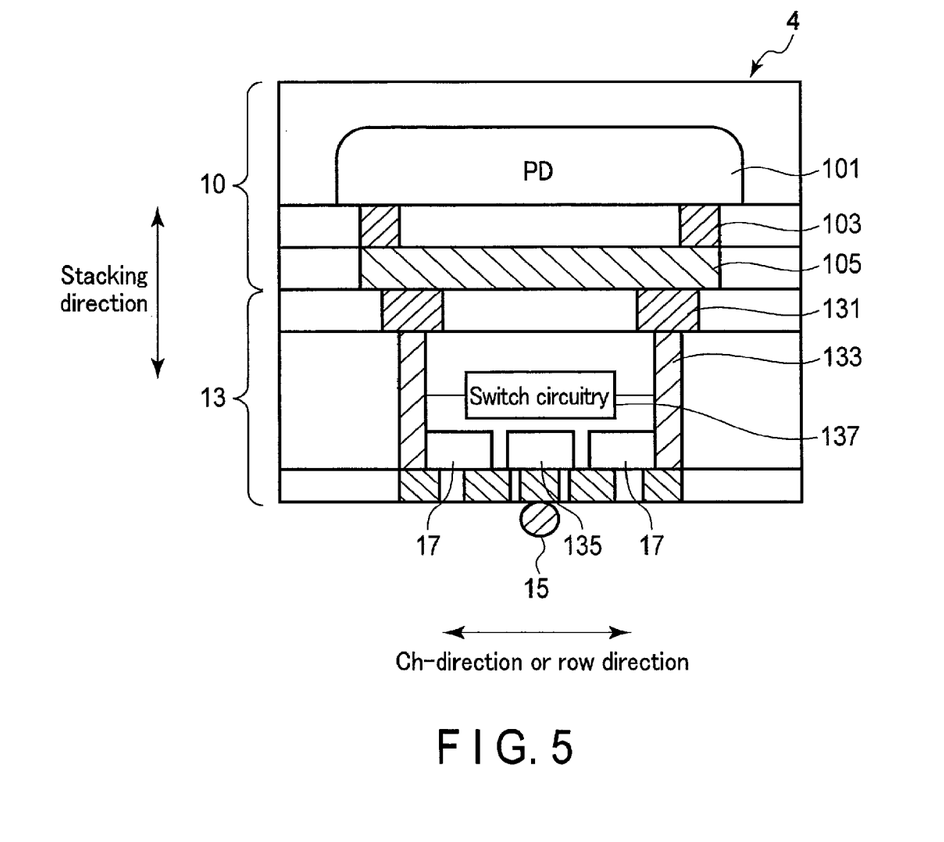
FIG. 5 is a diagram showing another example of the detector according to the first embodiment.

FIG. 5 is an example of a detector cell 4 of the detector 1 which includes the ADC chip 13 compatible with a sequential reading method.

The detector cell 4 shown in FIG. 5 includes a PDA chip 10, an ADC chip 13, and a terminal 15.

The detector cell 4 differs from the detector cell 2 shown in FIG. 2 in that the ADC chip 13 includes two integration circuits 17 and one ADC 135.

The integration circuits 17 are each electrically connected to the connection electrode 133, and integrate electrical signals to generate an integral signal.

When an integral signal is input from either one of the integration circuits 17, the ADC 135 performs an analog-digital conversion on the integral signal to generate a digital signal. The digital signal is output to the outside from the ADC 135.

Next, an example of the sequential reading method which uses the detector 1 including the detector cell 4 shown in FIG. 5 will be described with reference to FIGS. 6A and 6B.

Figure 6A:
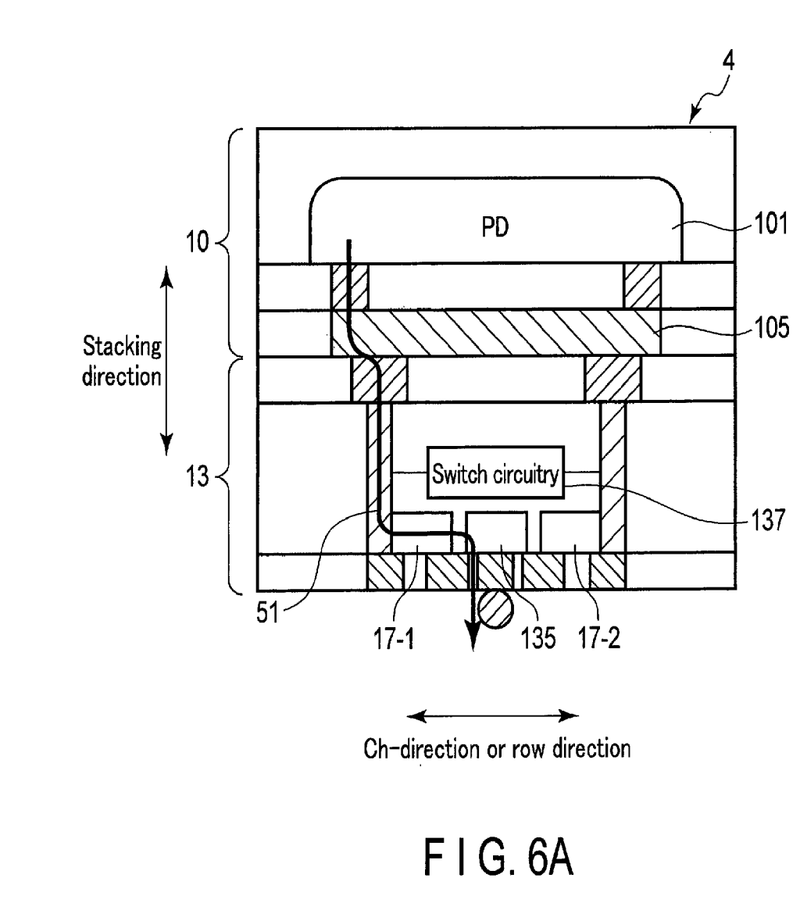
FIGS. 6A and 6B are diagrams showing an example of a sequential reading method, which uses an integral-type detector shown in FIG. 5.
Figure 6B:
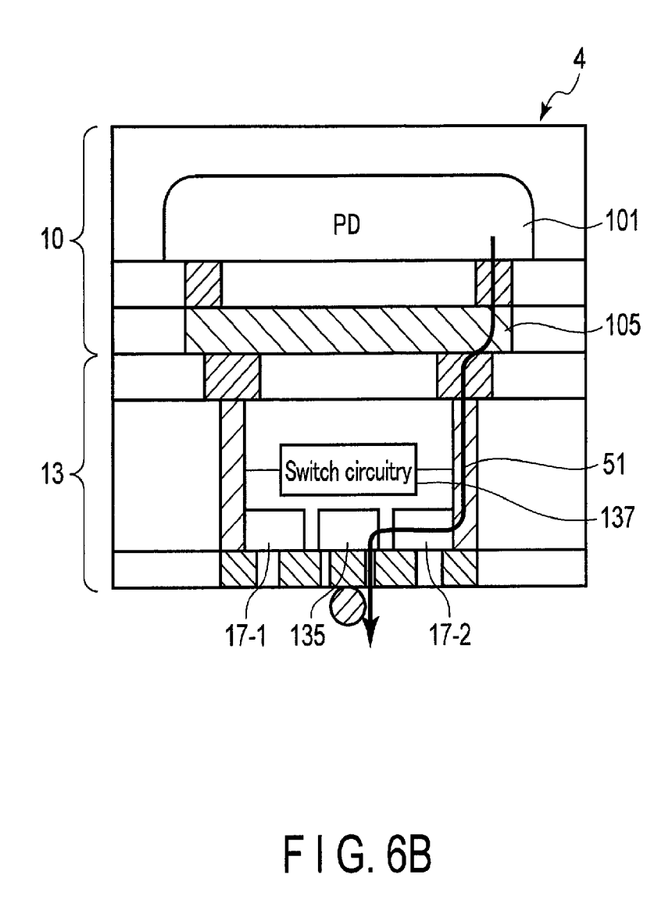

In FIG. 6A, the integral signal from the integration circuit 17-1 is input to the ADC 135, and a digital signal is output from the ADC 135. In FIG. 6B, the integral signal from the integration circuit 17-2 is input to the ADC 135, and a digital signal is output from the ADC 135.

For alternative reading of the integral signal, the switch circuitry 137 sequentially switches the integration circuit into which the electrical signal drawn from, for example, the interconnect layer 105 is input between the integration circuit 17-1 and the integration circuit 17-2. An integral signal may thereby be alternately read from the integration circuit 17-1 and integration circuit 17-2.

Next, another example of the sequential reading method which uses the detector 1 shown in FIG. 5 will be described with reference to FIG. 7.

Figure 7:
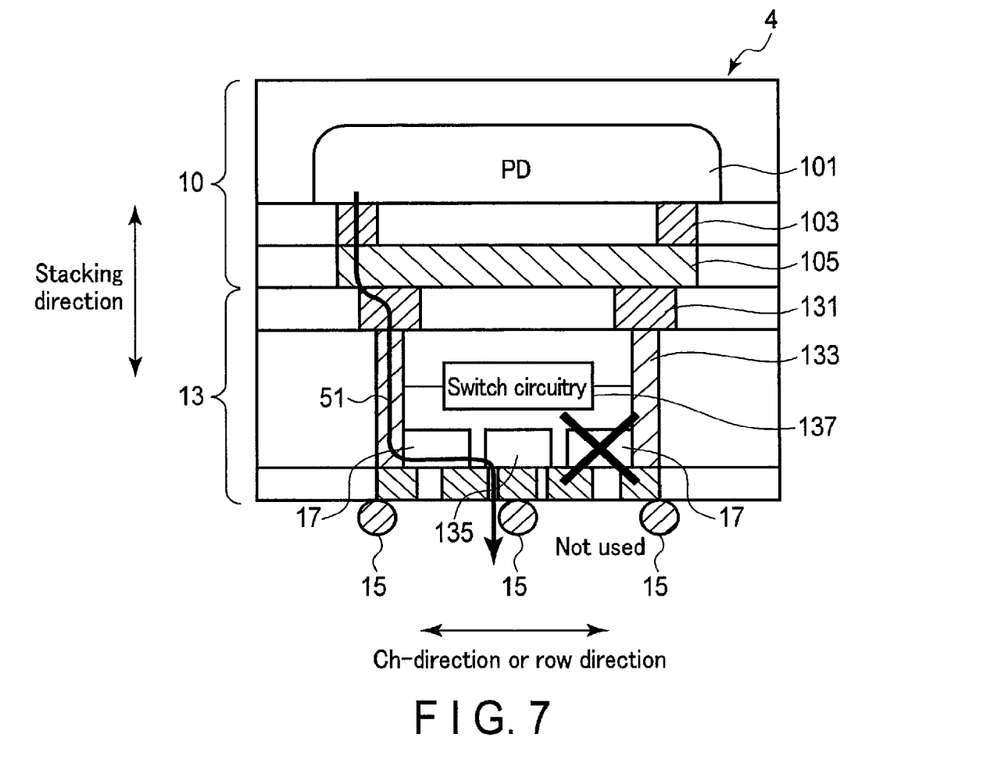
FIG. 7 is a diagram showing another example of the sequential reading method, which uses the integral-type detector shown in FIG. 5.

As shown in FIG. 7, an integral signal may be generated by one integration circuit 17 without using another integration circuit 17, and be input to the ADC 135.

Described above is the detector including the PDA chip 10 for the normal mode; however, the ADC chip 13 according to the first embodiment may be applied to the PDA chip for the high-definition mode, of course.

An example of the integral-type detector which uses the PDA chip 10 for the high-definition mode will be described with reference to FIG. 8.

Figure 8:
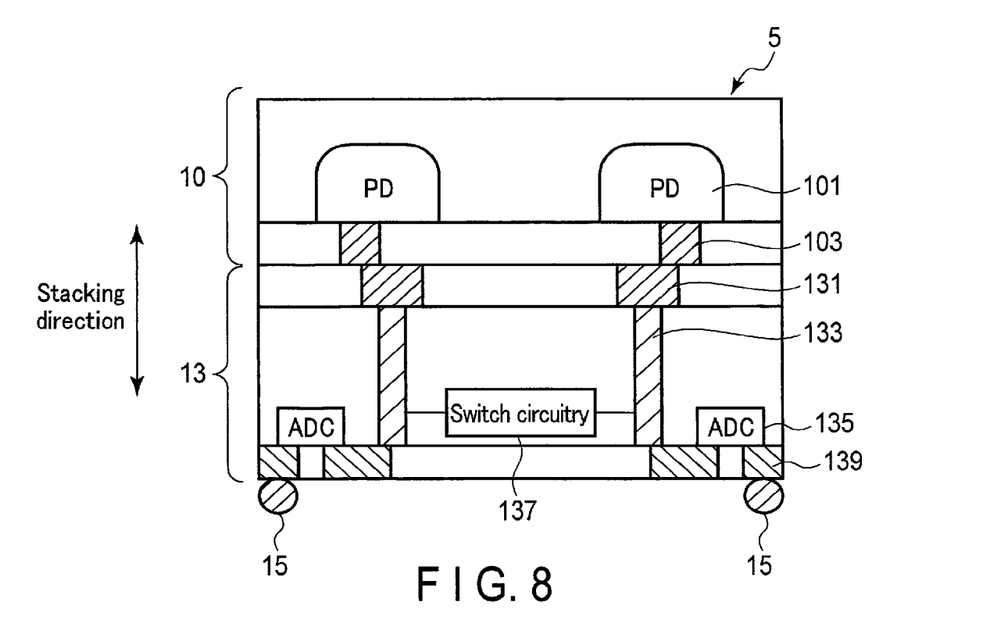
FIG. 8 is a diagram showing an example of an integral-type detector using a photo diode array (PDA) chip for a high-resolution mode.

As shown in FIG. 8, the PDA chip 10 is provided with two photodiodes for the high-definition mode. On the ADC chip 13 side, the switch circuitry 137 is turned off so that electrical signals from the two photodiodes are input to the respective ADCs 135 via the connection electrodes 133 of the ADC chip 13. Namely, the PDA chip 10 according to the present embodiment properly operates also in the high-definition mode.

According to the first embodiment, switch circuitry is provided in an ADC chip made for the high-definition mode, and the ADCs to which an electrical signal is input are switched when the electrical signal is read, so that an ADC chip can also be applied to the PDA chip for the normal mode. Namely, a common ADC chip can be used regardless of the resolution of the PDA chip, and an ADC chip, which is expensive and costly, need not be produced for each resolution. As a result, the cost can be reduced while taking advantage of the high performance of the integral-type detector.

Second Embodiment

In the second embodiment, an X-ray CT apparatus including the detector 1 according to the first embodiment will be described with reference to the block diagram of FIG. 9.

Figure 9:
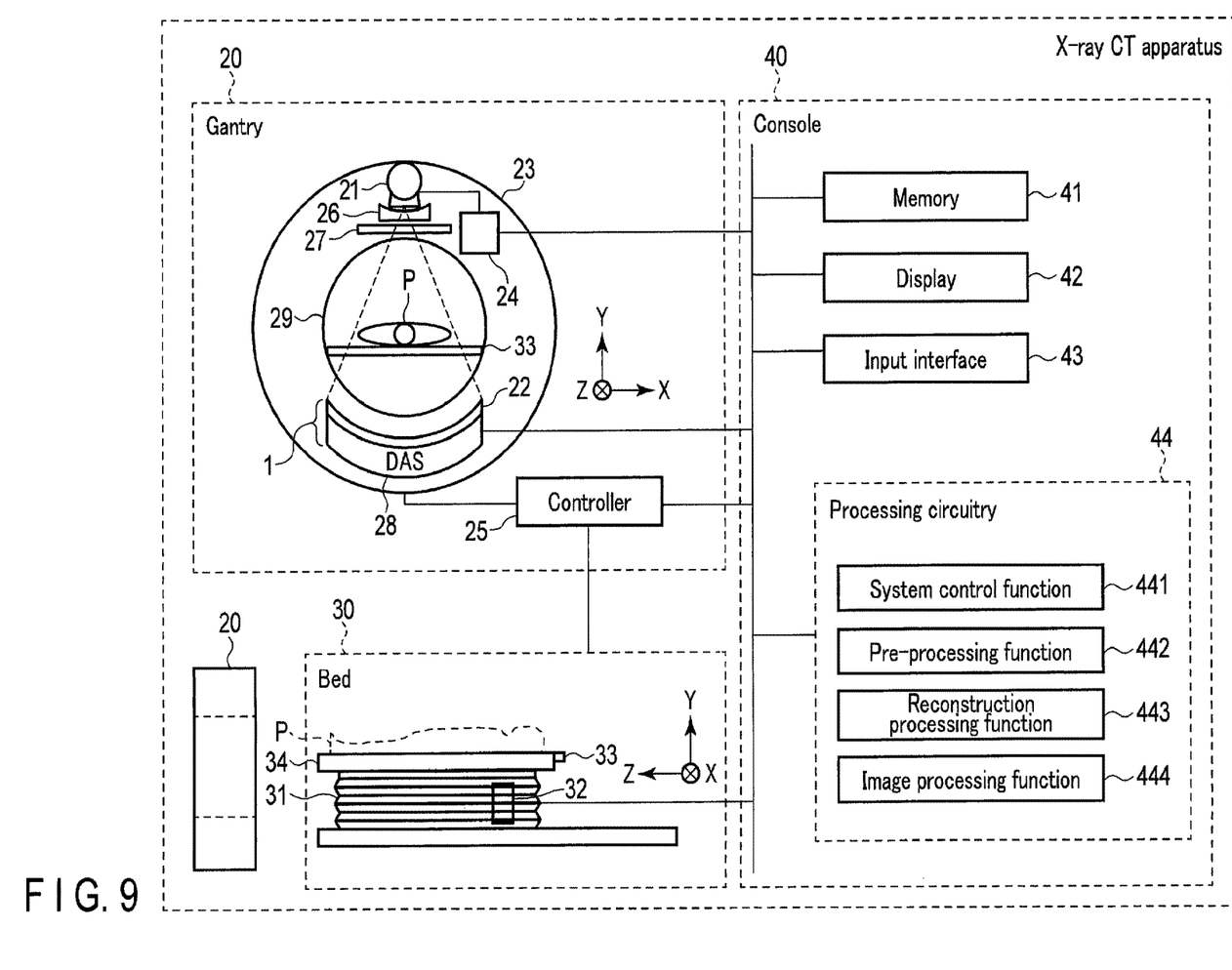
FIG. 9 is a diagram showing a configuration of an X-ray CT apparatus according to a second embodiment.

The X-ray CT apparatus 6 shown in FIG. 9 includes a gantry 20, a bed 30, and a console 40 which implements the processing of the X-ray CT apparatus. For convenience of explanation, FIG. 9 shows a plurality of gantries 20.

In the present embodiment, the rotation axis of a rotation frame 23 in a non-tilted state, or the longitudinal direction of a table top 33 of the bed 30, is defined as a "Z-axis direction"; the axial direction orthogonal to the Z-axis direction and horizontal to the floor is defined as an "X-axis direction"; and the axial direction orthogonal to the Z-axis direction and vertical to the floor is defined as a "Y-axis direction".

For example, the gantry 20 and the bed 30 are installed in a CT examination room, and the console 40 is installed in a control room adjacent to the CT examination room. The console 40 need not necessarily be installed in the control room. For example, the console 40 may be installed together with the gantry 20 and the bed 30 in the same room. In any case, the gantry 20, the bed 30, and the console 40 are communicably connected to one another by wire or radio.

The gantry 20 is a scanner which has a configuration for performing X-ray CT imaging on a subject P. The gantry 20 includes an X-ray tube 21, the detector 1, a rotation frame 23, an X-ray high voltage device 24, a controller 25, a wedge filter 26, a collimator 27, and a DAS 28.

The X-ray tube 21 is a vacuum tube that emits thermal electrons from a cathode (filament) to an anode (target) in response to application of a high voltage and supply of a filament current from the X-ray high voltage device 24 and thereby generates X-rays. Specifically, X-rays are generated when the thermal electrons collide with the target. An example of the X-ray tube 21 is a rotating anode X-ray tube configured to generate X-rays by emitting thermal electrons to a rotating anode. The X-rays generated in the X-ray tube 21 are formed into a cone-beam shape via, for example, the collimator 27, and are applied to the subject P.

The detector 1 is an integral-type detector in which the X-ray detector 22 is integrated with the DAS 28.

The detector 1 detects X-rays that have been emitted by the X-ray tube 21 and have passed through the subject P, and outputs an electrical signal corresponding to the dose of the X-rays to the DAS 28. The detector 1 includes, for example, a plurality of X-ray detection element lines, each including a plurality of X-ray detection elements aligned in a channel direction along an arc having a center at the focus of the X-ray tube 21. The detector 1 has an array structure in which a plurality of X-ray detection element lines, each including a plurality of X-ray detection elements aligned in the channel direction, are aligned in a slice direction (row direction).

Specifically, the detector 1 in FIG. 9 is assumed to be, for example, an indirect-conversion-type detector including a scintillator array, a grid, and an optical sensor array (PDA chip 10).

The scintillator array includes a plurality of scintillators. The scintillator includes a scintillator crystal which outputs light with a photon quantity corresponding to the incident X-ray intensity.

The grid is arranged on the X-ray incident side-surface of the scintillator array, and includes an X-ray shielding plate having the function of absorbing scattered X-rays. The grid is sometimes called a collimator (one-dimensional collimator or two-dimensional collimator).

The PDA chip 10 amplifies light received from the scintillator and converts it into an electrical signal.

The DAS 28 is implemented by, for example, an ASIC on which a circuit element capable of generating data is mounted.

The DAS 28 generates detection data which is digital data relating to the dose of X-rays detected by the detector 1, based on the read electrical signal. The detection data is a set of a channel number and row number of a source X-ray detection element, a view number indicating a projection angle, and data indicating the integral value of the doses of detected X-rays. The detection data is transferred to the console 40.

The DAS 28 includes not only the integration circuit and ADC, but also a preamplifier and a variable amplifier for each detection element. The preamplifier amplifies the electrical signal from the connected detection element with a predetermined gain. The variable amplifier amplifies the electrical signal from the preamplifier with a variable gain.

In addition to the X-ray tube 21 and the detector 1, the rotation frame 23 includes and supports the X-ray high voltage device 24 and the DAS 28. Such a rotation frame 23 is housed in an approximately cylindrical case with a bore 19 constituting an imaging space. The bore approximately agrees with the FOV. The central axis of the bore agrees with the rotation axis Z of the rotation frame 23. Detection data generated by the DAS 28 is transmitted, for example, from a transmitter including a light-emitting diode (LED) to a receiver (not shown) including a photodiode and provided on a non-rotating portion (such as a stationary frame; omitted in FIG. 6) of the gantry 20 by optical communication, and then transferred to the console 40. The method of transmitting detection data from the rotation frame to the non-rotating portion of the gantry 20 is not limited to the above-described optical communication, and may be any method as long as the transmission is non-contact type data transmission.

The X-ray high voltage device 24 includes: a high voltage generator including electrical circuitry such as a transformer, a rectifier, and the like and having the function of generating a high voltage to be applied to the X-ray tube 21 and a filament current to be supplied to the X-ray tube 21; and an X-ray controller configured to control an output voltage in accordance with the X-rays emitted by the X-ray tube 21. The high voltage generator may be of a transformer type or an inverter type. The X-ray high voltage device 24 may be provided in the rotation frame 23 to be described later, or in the stationary frame (not shown) of the gantry 20.

The controller 25 includes processing circuitry including a central processing unit (CPU) and the like, and a driver such as a motor, or an actuator. The processing circuitry 44 includes, as hardware resources, a processor such as a CPU or a micro processing unit (MPU), and a memory such as a ROM or a RAM. The controller 25 may be implemented by an ASIC, a field programmable gate array (FPGA), or another complex programmable logic device (CPLD) or simple programmable logic device (SPLD). The controller 25 controls the X-ray high voltage device 24, the DAS 28, and the like in accordance with a command from the console 40. The processor implements the above control by reading and executing a program stored in the memory.

The controller 25 also has the function of performing operation control of the gantry 20 and the bed 30 in response to an input signal from an input interface 43 (to be described later) attached to the console 40 or the gantry 20. For example, the controller 25 performs control to rotate the rotation frame 23, control to tilt the gantry 20, or control to operate the bed 30 and the table top 33 in response to an input signal. The control to tilt the gantry 20 is implemented by the controller 25 rotating the rotation frame 23 around an axis parallel to the X-axis direction based on tilt angle information input through the input interface 43 attached to the gantry 20. The controller 25 may be provided in the gantry 20 or in the console 40. The controller 25 may be configured by directly integrating a program in the circuitry of the processor, instead of storing a program in the memory. In this case, the processor implements the above-described control by reading and executing the program integrated in the circuitry.

The wedge filter 26 is a filter for adjusting the dose of X-rays emitted from the X-ray tube 21. Specifically, the wedge filter 26 is a filter that allows X-rays emitted from the X-ray tube 21 to pass therethrough and attenuates the X-rays so that the X-rays emitted from the X-ray tube 21 to the subject P exhibit a predetermined distribution. For example, the wedge filter 26 (wedge filter or bow-tie filter) is a filter obtained by processing aluminum to have a predetermined target angle and a predetermined thickness.

The collimator 27 is lead plates or the like for narrowing the application range of X-rays that have passed through the wedge filter 26, and includes a slit formed by combining the lead plates or the like. The collimator 27 may also be referred to as an X-ray diaphragm.

The bed 30 is a device to place thereon the subject P to be scanned and to move the subject P, and includes a base 31, a bed actuator 32, a table top 33, and a support frame 34.

The base 31 is a case that supports the support frame 34 movably in the vertical direction.

The bed actuator 32 is a motor or actuator that moves the table top 33 on which the subject P is placed in the longitudinal direction of the table top 33. The bed actuator 32 moves the table top 33 in accordance with control by the console 40 or control by the controller 25. For example, the bed actuator 32 moves the table top 33 in the direction orthogonal to the subject P so that the body axis of the subject P placed on the table top 33 matches the central axis of the bore of the rotation frame 23. The bed actuator 32 may also move the table top 33 in the body axis direction of the subject P in accordance with X-ray CT imaging executed using the gantry 20. The bed actuator 32 generates power by driving at a rotation speed corresponding to the duty ratio or the like of the drive signal from the controller 25. The bed actuator 32 is implemented by a motor, such as a direct drive motor or a servo motor.

The table top 33 provided on the top surface of the support frame 34 is a plate on which the subject P is placed. The bed actuator 32 may move not only the table top 33, but also the support frame 34 in the longitudinal direction of the table top 33.

The console 40 includes a memory 41, a display 42, an input interface 43, and processing circuitry 44. Data communication between the memory 41, the display 42, the input interface 43, and the processing circuitry 44 is performed via a bus. The console 40 is described as a device separate from the gantry 20; however, the console 40 or part of the components of the console 40 may be included in the gantry 20.

The memory 41 is a storage device, such as a hard disk drive (HDD), a solid state drive (SSD), or an integrated circuit storage device, which stores various types of information. The memory 41 stores, for example, projection data and reconstructed image data. The memory 41 may be not only the HDD, SSD, or the like, but also a driver that writes and reads various types of information to and from, for example, a portable storage medium such as a compact disc (CD), a digital versatile disc (DVD), or a flash memory, or a semiconductor memory such as a random access memory (RAM). The storage area of the memory 41 may be in the X-ray CT apparatus 6, or in an external storage device connected via the network. For example, the memory 41 stores data of a CT image or a display image. The memory 41 also stores a control program according to the present embodiment.

The display 42 displays various types of information. For example, the display 42 outputs a medical image (CT image) generated by the processing circuitry 44, a graphical user interface (GUI) or the like for receiving various types of operations from the operator, and the like. For the display 42, for example, a liquid crystal display (LCD), a cathode ray tube (CRT) display, an organic electro luminescence display (OELD), a plasma display, or any other display can be used as appropriate. The display 42 may be provided in the gantry 20. The display 42 may be a desktop type, or constituted by a tablet terminal capable of wireless communication with the main body of the console 40.

The input interface 43 receives various input operations from the operator, converts a received input operation into an electrical signal, and outputs the electrical signal to the processing circuitry 44. For example, the input interface 43 receives, from the operator, a collection condition for collecting projection data, a reconstruction condition for reconstructing a CT image, an image processing condition for generating a post-processing image from the CT image, and the like. As the input interface 43, for example, a mouse, a keyboard, a trackball, a switch, a button, a joystick, a touch pad, or a touch panel display can be used as appropriate. In the present embodiment, the input interface 43 need not necessarily include a physical operation component such as a mouse, a keyboard, a trackball, a switch, a button, a joystick, a touch pad, or a touch panel display. Examples of the input interface 43 also include electrical signal processing circuitry that receives an electrical signal corresponding to an input operation from an external input device provided separately from the console 40, and outputs the electrical signal to the processing circuitry 44. The input interface 43 may be provided in the gantry 20. The input interface 43 may also be constituted by a tablet terminal or the like capable of wireless communication with the main body of the console 40.

The processing circuitry 44 controls the overall operation of the X-ray CT apparatus 6 in accordance with the electrical signal of the input operation output from the input interface 43. For example, the processing circuitry 44 includes, as hardware resources, a processor such as a CPU, an MPU, or a graphics processing unit (GPU), and a memory such as a ROM or a RAM. With the processor which executes a program loaded into the memory, the processing circuitry 44 executes a system control function 441, a pre-processing function 442, a reconstruction function 443, and an image processing function 444. Each of the functions (system control function 441, pre-processing function 442, reconstruction function 443, and image processing function 444) need not necessarily be implemented by a single processing circuit. Processing circuitry may be configured by combining a plurality of independent processors that execute respective programs to implement the respective functions.

The system control function 441 controls each function of the processing circuitry 44 based on an input operation received from the operator via the input interface 43. Specifically, the system control function 441 reads a control program stored in the memory 41, loads it into the memory in the processing circuitry 44, and controls each part of the X-ray CT apparatus 6 in accordance with the loaded control program.

The pre-processing function 442 generates data obtained by performing pre-processing, such as logarithmic conversion processing, offset correction processing, processing for sensitivity correction between channels, or beam hardening correction, on detection data output from the DAS 28. The data before pre-processing (detection data) and data after pre-processing may be collectively referred to as projection data.

The reconstruction function 443 generates CT image data by performing reconstruction processing using a filtered back projection method (FBP method), a sequential approximation reconstruction method, or the like on the projection data generated by the pre-processing function 442.

The image processing function 444 performs processing for converting CT image data generated by the reconstruction function 443 into tomographic image data of a given cross section or three-dimensional image data, based on an input operation received from the operator via the input interface 43. The generation of the three-dimensional image data may be directly performed by the reconstruction function 443.

The processing circuitry 44 also performs scan control processing and display control processing.

The scan control processing is processing for controlling various operations relating to X-ray scanning, such as causing the X-ray high voltage device 24 to supply a high voltage to cause the X-ray tube 21 to emit X-rays.

The display control processing is processing for controlling the display 42 to display information on the progress or result of the processing of each function or process of the processing circuitry 44.

The processing circuitry 44 need not necessarily be included in the console 40, and may be included in an integrated server which collectively performs processing on data obtained at a plurality of medical image diagnostic apparatuses.

According to the above-described second embodiment, use of the ADC chip applicable to any resolution can reduce the cost of the X-ray CT apparatus while improving the performance of the X-ray detector.

The console 40 is described above as performing a plurality of functions with a single console; however, it is possible to perform a plurality of functions with separate consoles.

The X-ray CT apparatus has various types such as a rotate/rotate type (third generation CT) in which the X-ray tube and detector integrally rotate around the subject P, and a stationary/rotate type (fourth generation CT) in which many X-ray detectors annularly arrayed are fixed and only the X-ray tube rotates around the subject P, which are all applicable to the present embodiment.

Furthermore, the present embodiment may be applied to a single-tube type X-ray CT apparatus, and a so-called multi-tube type X-ray CT apparatus, in which multiple pairs of an X-ray tube and a detector are mounted on the rotating ring.

In addition, the functions of the embodiments may also be implemented by installing programs that execute respective processes in a computer, such as a work station, and loading them in the memory. The program that causes the computer to execute the technique can be stored and distributed by means of a storage medium, such as a magnetic disc (a hard disc, etc.), an optical disc (CD-ROM, DVD, Blu-ray (registered trademark), etc.), and a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A converter array comprising:
   a first substrate; and
   multiple sets of a plurality of analog-digital converters and a switch which are arranged on the first substrate in array, wherein
   the switch is configured to switch a connection relationship between the plurality of analog-digital converters to process signals from photodiodes smaller in number than the analog-digital converters.

2. The converter array according to claim 1, wherein
the switch is turned on when a photodiode for a normal resolution is connected, and
the signals are read out by sequential switching between the plurality of analog-digital converters.

3. A detector comprising:
the converter array according to claim 1;
a second substrate stacked on the converter array;
one or more photodiodes arranged on the second substrate and smaller in number than the plurality of analog-digital converters; and
an interconnect layer arranged between the converter array and the second substrate and configured to bundle the signals from the one or more photodiodes,
wherein the one or more photodiodes and the interconnect layer are arrayed in correspondence with the multiple sets of the plurality of analog-digital converters and the switch.

4. The detector according to claim 3, wherein
the switch is turned on when the one or more photodiodes are for processing of a pixel size of a normal resolution, and
the signals are read out by sequential switching between the analog-digital converters.

5. The detector according to claim 3, wherein
the interconnect layer is formed on a surface of the second substrate opposed to the first substrate.

6. The detector according to claim 3, wherein
the one or more photodiodes are for processing of a pixel size of a normal resolution, and
the plurality of analog-digital converters are for processing of a pixel size of a high-definition resolution, the pixel size of the high-definition resolution being smaller than the pixel size of the normal resolution.

* * * * *